United States Patent [19]
Kwon

[11] Patent Number: 5,847,999
[45] Date of Patent: Dec. 8, 1998

[54] INTEGRATED CIRCUIT MEMORY DEVICES HAVING VARIABLE BLOCK SIZE ERASE CAPABILITY

[75] Inventor: Suk Chun Kwon, Seoul, Rep. of Korea

[73] Assignee: Samsung Electronics Co., Ltd., Suwon, Rep. of Korea

[21] Appl. No.: 927,605

[22] Filed: Sep. 12, 1997

[30] Foreign Application Priority Data

Sep. 13, 1996 [KR] Rep. of Korea ................ 1996-39905

[51] Int. Cl.$^6$ .................................................. G11C 13/00
[52] U.S. Cl. ...................................... 365/185.33; 365/218
[58] Field of Search ............................. 365/185.33, 218, 365/189.01, 230.01

[56] References Cited

U.S. PATENT DOCUMENTS

| | | | |
|---|---|---|---|
| 5,270,980 | 12/1993 | Pathak et al. ............................ | 365/218 |
| 5,287,318 | 2/1994 | Kuki et al. ............................... | 365/218 |
| 5,371,702 | 12/1994 | Nakai et al. ............................. | 365/185 |
| 5,384,742 | 1/1995 | Miyakawa et al. ...................... | 365/128 |
| 5,414,664 | 5/1995 | Lin et al. ................................. | 365/218 |
| 5,596,530 | 1/1997 | Lin et al. ............................. | 365/185.29 |
| 5,615,148 | 3/1997 | Yamamura et al. ............... | 365/185.11 |
| 5,627,838 | 5/1997 | Lin et al. ................................ | 371/21.1 |

*Primary Examiner*—Terrell W. Fears
*Attorney, Agent, or Firm*—Myers Bigel Sibley & Sajovec

[57] ABSTRACT

Integrated circuit memory devices include circuits that can perform erase operations on multiple blocks of data simultaneously using preferred addressing techniques. The memory device contains blocks of memory cells and local decoders that are responsive to predecoded block address signals and electrically coupled a respective one of the blocks. A block size modifying circuit is electrically coupled to the local decoders and is responsive to a block size data signal and a first block address signal. The modifying circuit enables the simultaneous erasure of multiple blocks of memory cells during an erase time interval by generating the predecoded block address signals to select multiple ones of the local decoders simultaneously. The block size modifying circuit preferably comprises a block size decoder that is responsive to the block size data signal and an erase flag signal and performs the functions of decoding the block size data signal as a decoded block size data signal if the erase flag signal is in a first logic state and generating a modify disable signal if the erase flag signal is in a second logic state. A block address register performs the functions of passing the first block address signal as a second block address signal upon detection of the modify disable signal and generating a multi-block address erase signal upon detection of the decoded block size data signal. A block address predecoder performs the functions of generating the predecoded block address signal to select a single one of the plurality of local decoders upon detection of the second block address signal or select multiple ones of the plurality of local decoders upon detection of the multi-block address erase signal.

10 Claims, 8 Drawing Sheets

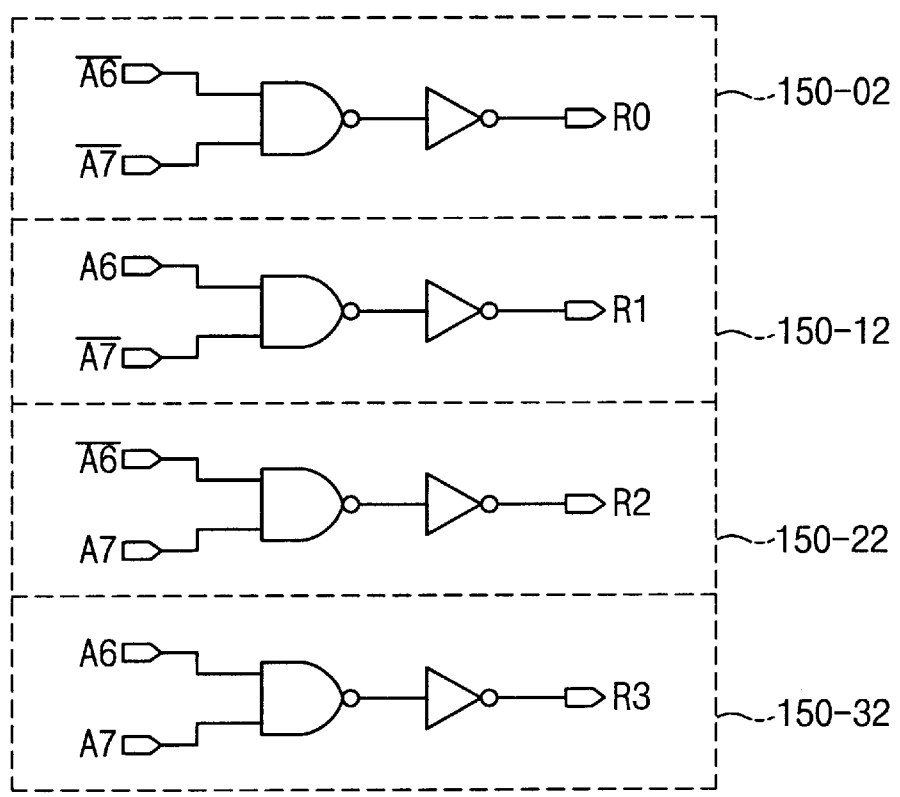

INTEGRATED CIRCUIT MEMORY DEVICES HAVING VARIABLE BLOCK SIZE ERASE CAPABILITY

FIELD OF THE INVENTION

The present invention relates to integrated circuit memory devices, and more particularly to integrated circuit memory devices having block erase capability.

BACKGROUND OF THE INVENTION

Conventional techniques for erasing a plurality of memory cells in an integrated circuit memory device such as a flash EEPROM memory devices have included operations for performing the simultaneous erasure of multiple memory cells within a block of memory cells. Unfortunately, as the sizes of blocks of memory have increased in response to higher integration levels, the operations for performing the simultaneous erasure of all memory cells within a block have become complicated and have often required the use of multiple consecutive erase cycles which may be time consuming. Moreover, the ability to erase multiple sectors of memory within a block may be limited by the internal hardwiring of the memory cells within each block. Accordingly, notwithstanding conventional operations for performing simultaneous erasure, there continues to be a need for developing integrated circuit memory devices that are capable of performing highly efficient erase operations.

SUMMARY OF THE INVENTION

It is therefore an object of the present invention to provide improved integrated circuit memory devices.

It is another object of the present invention to provide integrated circuit memory devices that can perform erase operations efficiently.

These and other objects, advantages and features of the present invention are provided by integrated circuit memory devices that can perform erase operations on multiple blocks of data simultaneously using preferred addressing techniques. In particular, according to one embodiment of the present invention, an integrated circuit memory device is provided that contains a memory cell array with a plurality of blocks of memory cells therein and a plurality of local decoders that are responsive to a predecoded block address signal. The blocks of memory cells may each comprise a plurality of NAND strings of EEPROM memory cells. Each of the local decoders is electrically coupled a respective one of the plurality of blocks of memory cells.

To perform the multiple block erase operations simultaneously, a block size modifying circuit is preferable provided. The block size modifying circuit is electrically coupled to the plurality of local decoders and is responsive to a block size data signal and a first block address signal. According to a preferred aspect of the present invention, the block size modifying circuit performs the function of enabling the simultaneous erasure of multiple ones of the plurality of blocks of memory cells during an erase time interval. This function is performed by generating the predecoded block address signals to select multiple ones of the plurality of local decoders simultaneously. The block size modifying circuit preferably comprises a block size decoder that is responsive to the block size data signal and an erase flag signal. The block size decoder performs the functions of decoding the block size data signal as a decoded block size data signal if the erase flag signal is in a first logic state (e.g., logic 1), and generating a modify disable signal if the erase flag signal is in a second logic state (e.g., logic 0). A block address register is also provided. The block address register is coupled to an output of the block size decoder and is responsive to the first block address signal. The block address register performs the functions of passing the first block address signal as a second block address signal upon detection of the modify disable signal and generating a multi-block address erase signal upon detection of the decoded block size data signal. In addition, a block address predecoder is provided. The block address predecoder is coupled to an output of the block address register and performs the functions of generating the predecoded block address signal to select a single one of the plurality of local decoders upon detection of the second block address signal or select multiple ones of the plurality of local decoders upon detection of the multi-block address erase signal. According to another preferred aspect of the present invention, the number of local decoders selected upon the detection of the multi-block address erase signal is $2^n$ when the binary value of the block size data signal is $2^n$, where n is an integer. For example, in the event the memory device contains 256 blocks of memory cells, 2, 4, 8, 16, 32, 64, 128 blocks may be erased simultaneously to thereby eliminate the need to perform repeated consecutive erase operations to erase large portions of the memory device.

BRIEF DESCRIPTION OF THE DRAWINGS

FIGS. 6–8 are electrical schematics of a block address predecoder according to the block size modifying unit of FIG. 1.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
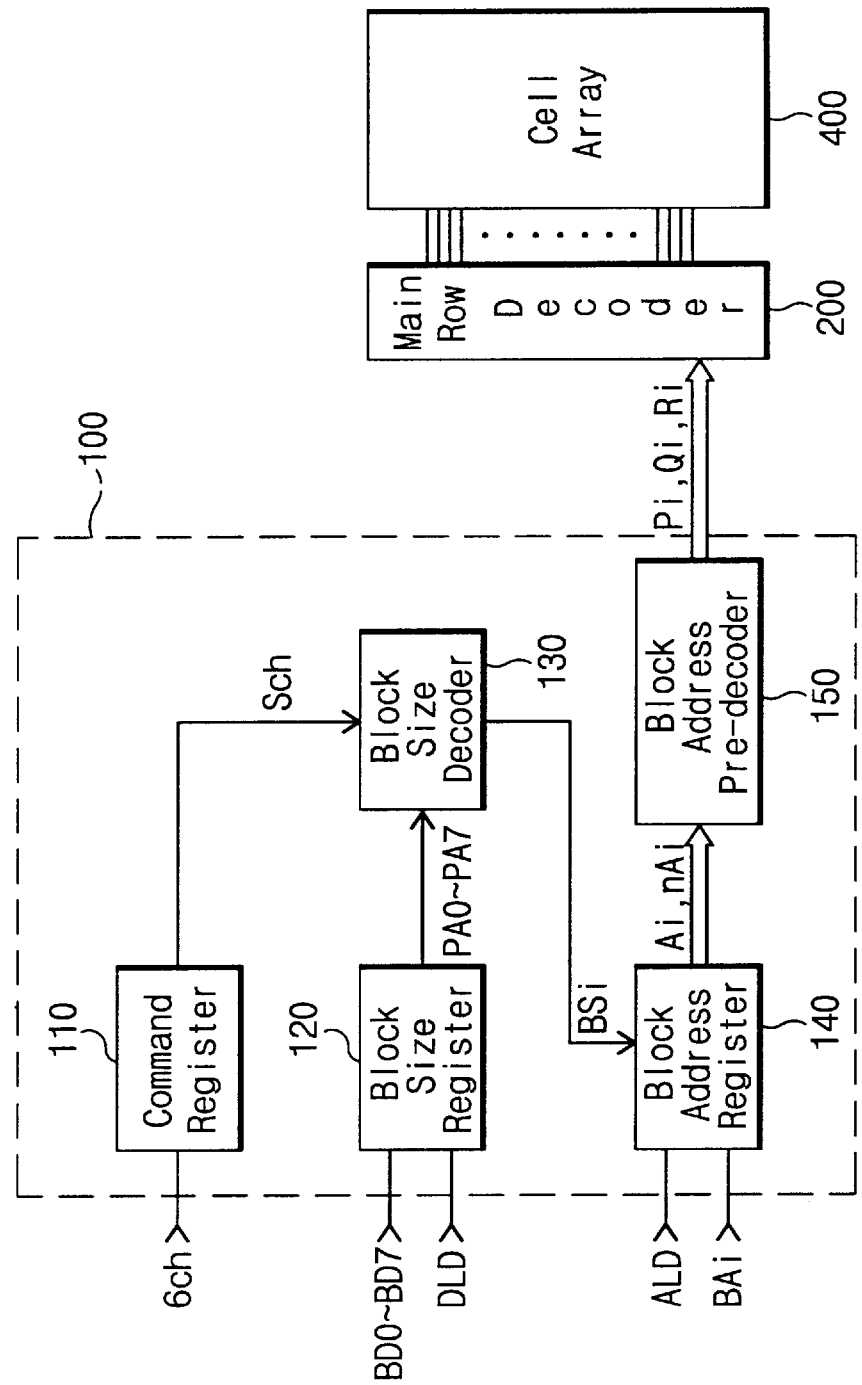
FIG. 1 is a block schematic of an integrated circuit memory device containing a block size modifying unit, according to an embodiment of the present invention.

Referring now to FIG. 1, a block schematic of a preferred integrated circuit memory device containing a block size modifying unit will be described. In particular, the memory device contains a memory cell array 400 which is electrically coupled to a main row/block decoder 200. The main decoder 200 is responsive to predecoded block address signals $P_i$, $Q_i$ and $R_i$. To perform multiple block erase operations simultaneously, a modifying unit 100 is preferable provided. The modifying unit 100 is illustrated as containing a command register 110 for generating an erase flag signal SCH in response to a predetermined command signal 6CH, a block size register 120 for generating a block size data signal (PA0–PA7) in response to block data signals BD0–BD7 and a data loading signal DLD.

In addition, the modifying unit 100 comprises a preferred block size modifying circuit. The block size modifying circuit generates the predecoded block address signals $P_i$, $Q_i$ and $R_i$ at the output of the modifying unit 100 and is responsive to the block size data signal PA0–PA7, a first block address signal BAi, an address loading signal ALD and a erase flag signal SCH. As described more fully hereinbelow, the block size modifying circuit performs the function of enabling the simultaneous erasure of multiple ones of the plurality of blocks of memory cells during an erase time interval. This function is performed by generating the predecoded block address signals to select multiple ones of the plurality of local decoders at the same time.

The block size modifying circuit preferably comprises a block size decoder 130 that is responsive to the block size data signal PA0–PA7 and the erase flag signal SCH. The block size decoder 130 performs the functions of decoding the block size data signal PA0–PA7 as a decoded block size data signal BSi (e.g., BS0–BS7) if the erase flag signal SCH is in a first logic state (e.g., logic 1), and generating a modify disable signal (BS0–BS7=00000000) if the erase flag signal is in a second logic state (e.g., logic 0). A block address register 140 is also provided. The block address register is coupled to an output of the block size decoder 130 and is responsive to the first block address signal BAi (e.g., BA0–BA7). The block address register 140 performs the functions of passing the first block address signal BAi into a latch and then out as a second block address signal (where A0–A7≠$\overline{A0}$–$\overline{A7}$) upon detection of the modify disable signal and generating a multi-block address erase signal (where A0–A7=$\overline{A0}$–$\overline{A7}$) upon detection of the decoded block size data signal (BS0–BS7≠00000000). In addition, a block address predecoder 150 is provided. The block address predecoder 150 is coupled to an output of the block address register 140 and performs the functions of generating the predecoded block address signals $P_i$, $Q_i$ and $R_i$ which select a single one of the plurality of local decoders 200-i (e.g., where i=1–256) upon detection of the second block address signal or select multiple ones of the plurality of local decoders upon detection of the multi-block address erase signal. Preferably, the number of local decoders selected upon the detection of the multi-block address erase signal is $2^n$ when the binary value of the block size data signal is $2^n$, where n is an integer. For example, in the event the memory device contains 256 blocks of memory cells, 2, 4, 8, 16, 32, 64, 128 may be erased simultaneously to thereby eliminate the need to perform repeated consecutive erase operations to erase large portions of the memory device.

Figure 2:
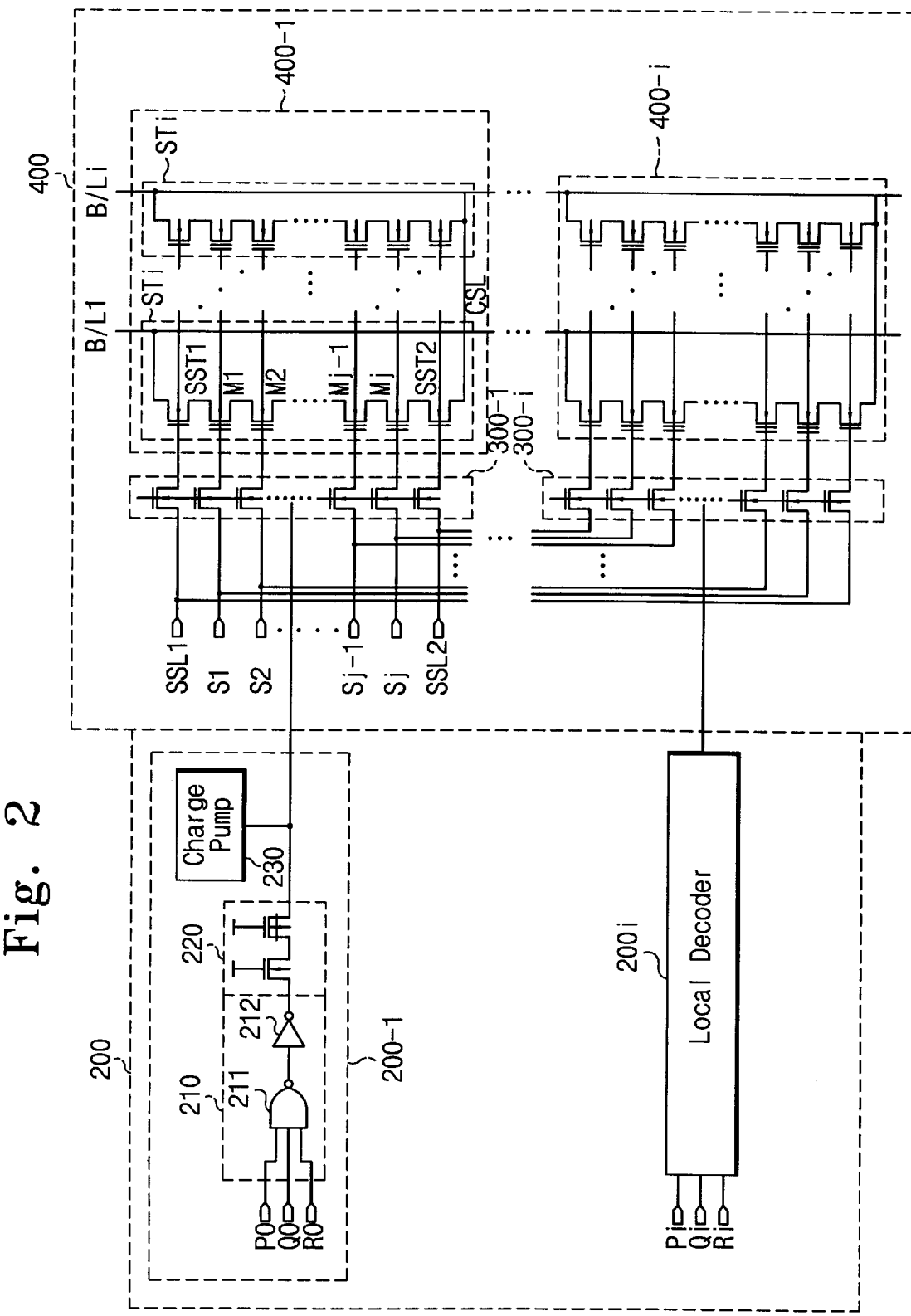
FIG. 2 is an electrical schematic of a row decoder and memory cell array according to the memory device of FIG. 1.

Referring now to FIG. 2, a preferred construction of the memory cell array 400 and row/block decoder 200 will be described. In particular, the memory cell array 400 preferably comprise a plurality of memory cells arranged as a plurality of blocks 400-1 to 400-i (e.g., i=256). As illustrated, each block of memory cells contains a plurality of strings ST1–STi of memory cells electrically connected to respective bit lines B/L1 to B/Li. Here, the illustrated strings of memory cells are NAND strings containing EEPROM memory cells M1–Mj and first and second string select transistors SST1 and SST2, respectively, however other well known memory cells may be used as well. Each of the first string select transistors SST1 is electrically coupled at a drain end to a respective bit line and each of the second string select transistors SST2 is electrically coupled at a source end to a common source line CSL. The gate electrodes of the first and second string select transistors SST1 and SST2 in each block are electrically coupled to first and second string select lines SSL1 and SSL2 and the gate electrodes of the EEPROM memory cells in each block are electrically coupled to a plurality of word lines S1–Sj, as illustrated. Strings of pass transistors 300-1 to 300-i are also electrically coupled between each block of memory cells and a respective one of the local decoders 200-1 to 200-i. For example, as illustrated, each of the pass transistors in a string is electrically connected in series with a respective string select line (SSL1, SSL2) or a word line (S1–Sj).

Each of the local decoders 200-1 to 200-i receives respective ones of the predecoded block address signals $P_i$, $Q_i$, and $R_i$. For example, if i=256, the local decoders are configured to receive the following predecoded block address signals: (($P_0,Q_0,R_0$), ($P_1,Q_0,R_0$), ($P_2,Q_0,R_0$), ($P_3,Q_0,R_0$), ($P_4,Q_0,R_0$), ($P_5,Q_0,R_0$), ($P_6,Q_0,R_0$), ($P_7,Q_0,R_0$), ($P_0,Q_1,R_0$), ($P_1,Q_1,R_0$), ($P_2,Q_1,R_0$), . . . ($P_7,Q_7,R_0$), ($P_0,Q_0,R_1$), . . . ($P_1,Q_7,R_3$), Referring now to the first local decoder 200-1, an input gate circuit 210 containing a 3-input NAND gate 211 and an inverter 212 is provided. The output of the inverter 212 is electrically coupled to the gate electrodes of the pass transistors in the string 300-1, through a series connection of two pass transistors (one enhancement-mode FET and one depletion-mode FET) in a unilateral path switch 220. The gates of the two pass transistors are electrically connected to a power supply potential, as illustrated. A charge pump 230 is also electrically coupled to the output of the inverter 212.

Figure 3:
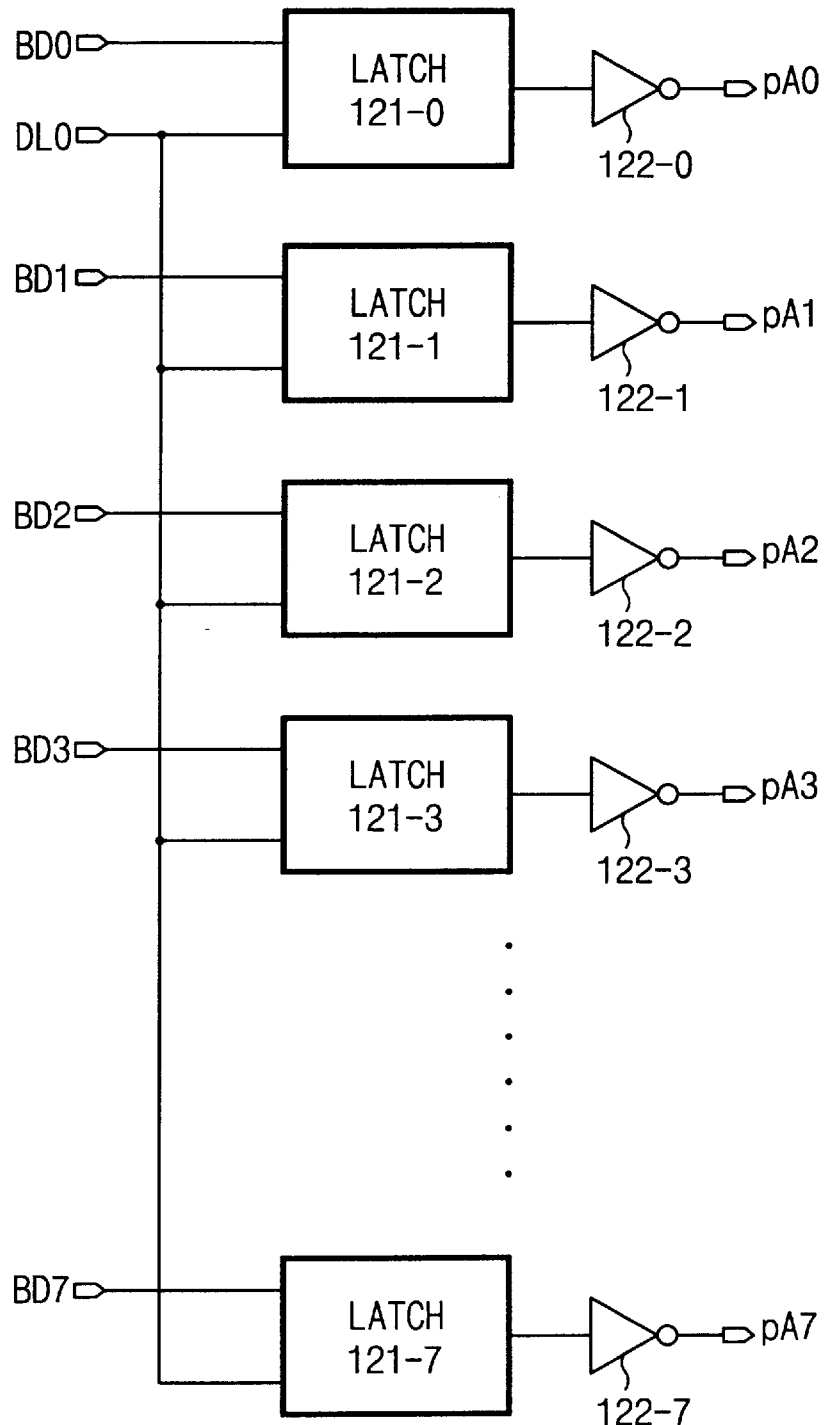
FIG. 3 is an electrical schematic of a block size register according to the block size modifying unit of FIG. 1.

Referring now to FIG. 3, the block size register 120 for generating a block size data signal (PA0–PA7) in response to block data signals BD0–BD7 and a data loading signal DLD, will be described. In particular, the data loading signal DLD acts as a clock signal to a plurality of latches 121-0 to 121-7. Accordingly, the occurrence of a predetermined data loading signal causes the block data signals BD0–BD7 to be latched. In the event the outputs of the latches are noninverting, the block size data signals PA0–PA7 will represent the binary complement of the block data signals BD0–BD7 because of the presence of the output inverters 122-0 to 122-7.

Figure 4:
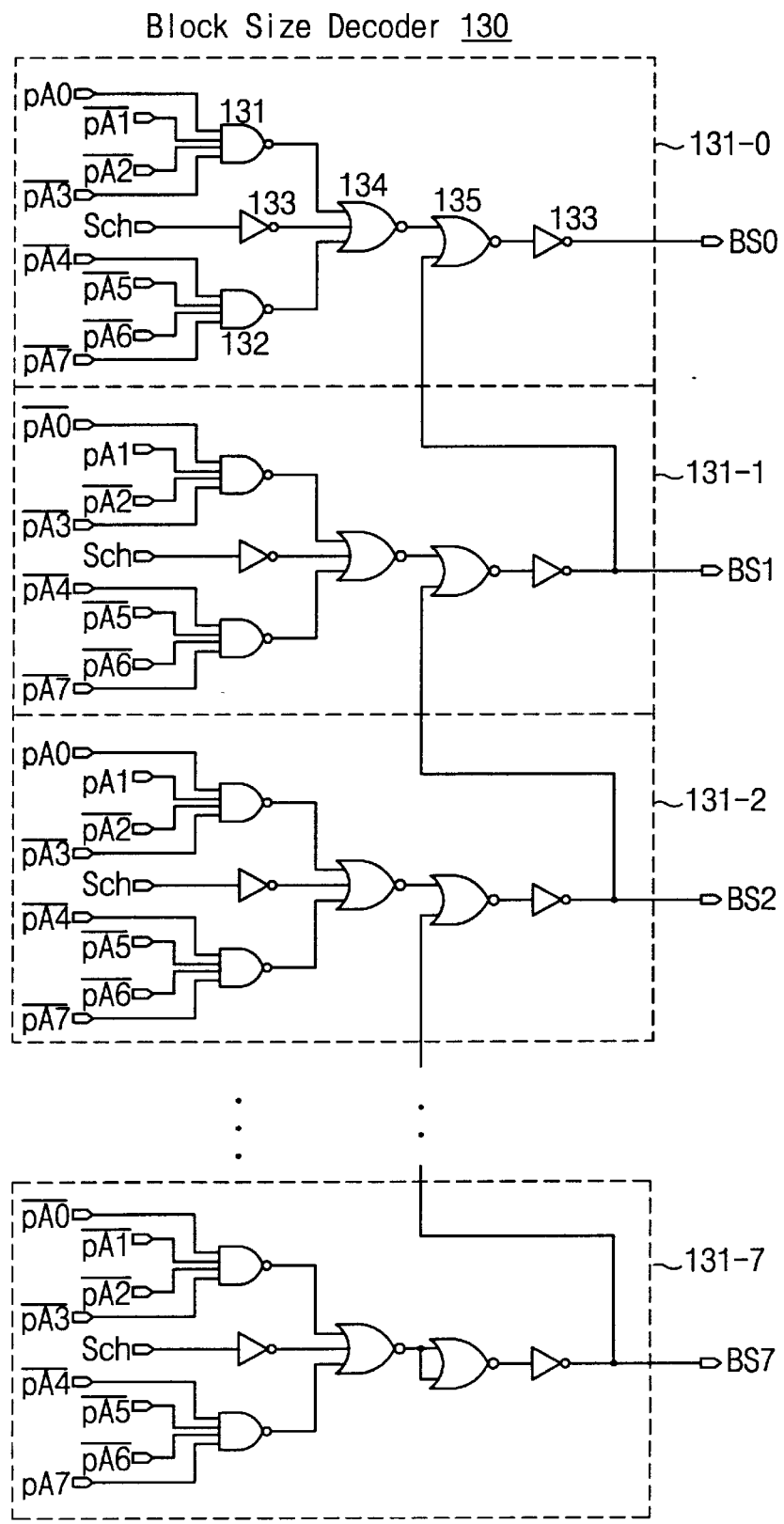
FIG. 4 is an electrical schematic of a block size decoder according to the block size modifying unit of FIG. 1.

Referring now to FIG. 4, a preferred block size decoder 130 is illustrated. The block size decoder 130 is responsive to the block size data signal PA0–PA7 and is responsive to the erase flag signal SCH which is generated by the command register 110. The block size decoder 130 is illustrated as containing unit decoders 131-0 to 131-7 and each unit decoder contains two 4-input NAND gates 131–132, two inverters 133, and two NOR gates 134 and 135. The block size decoder 130 performs the functions of decoding the block size data signal PA0–PA7 as a decoded block size data signal BSi (e.g., BS0–BS7) if the erase flag signal SCH is in a first logic state (e.g., logic 1), and generating a modify disable signal (BS0–BS7=00000000) if the erase flag signal is in a second logic state (e.g., logic 0). For example, if a logic 1 erase flag signal SCH is received, then the receipt of a block size data signal equal to 01 hex will result in the generation of a decoded block size data signal BSi=01 hex. In addition, the receipt of a block size data signal equal to 02, 04, 08,10, 20, 40, 80 hex will result in the generation of a decoded block size data signal BSi=03, 07, 0F, 1F, 3F, 7F, FF hex, respectively.

Figure 5:
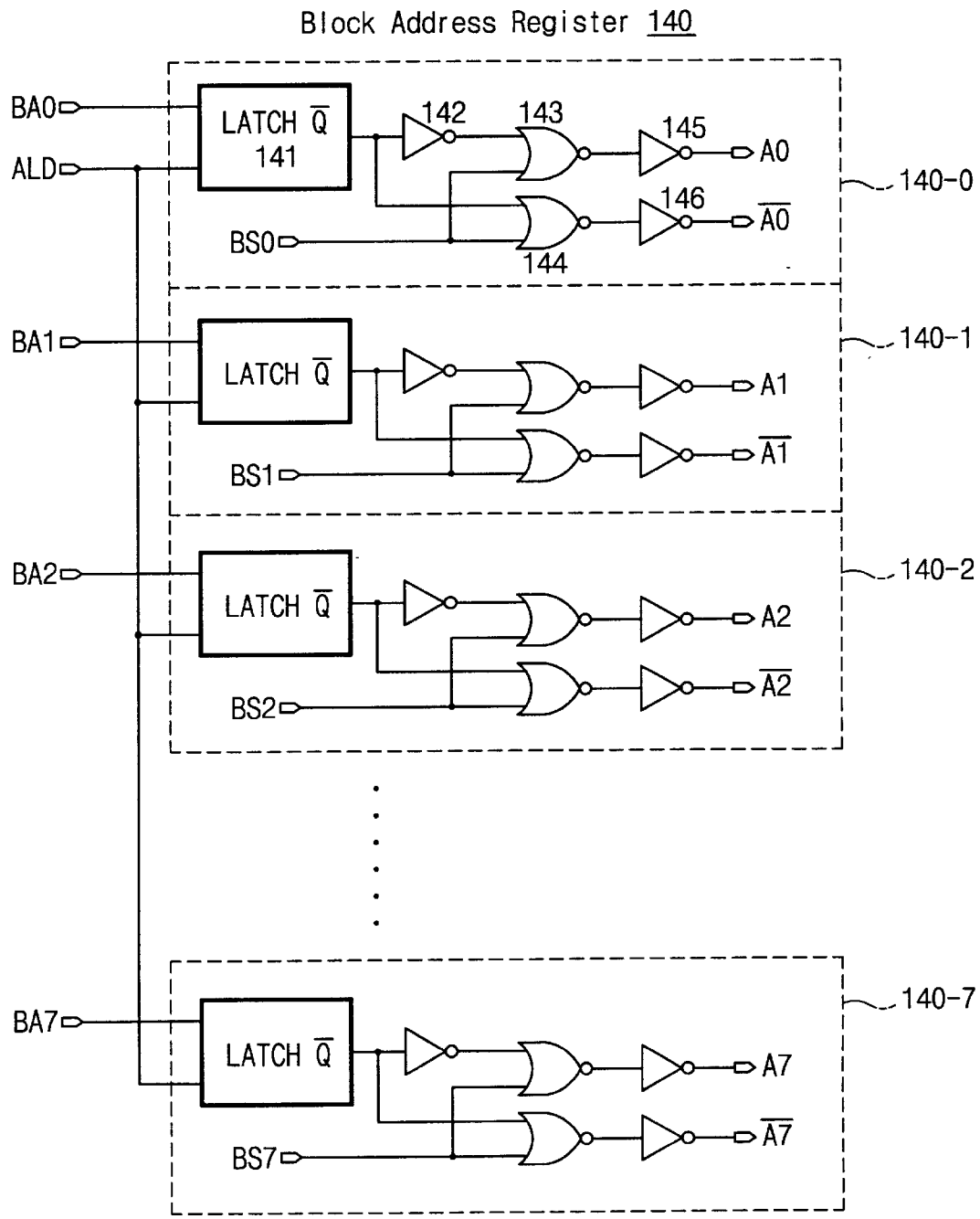
FIG. 5 is an electrical schematic of a block address register according to the block size modifying unit of FIG. 1.

Referring now to FIG. 5, a block address register 140 is also provided. The block address register is coupled to an output of the block size decoder 130 and is responsive to the first block address signal BAi (e.g., BA0–BA7), the address loading signal ALD and the decoded block size data signal BSi. The block address register 140 contains a plurality of register units 140-0 to 140-7 and each register unit contains a latch 141, inverters 142,145 and 146 and NOR gates 143 and 144, as illustrated. The block address register 140 performs the functions of passing the first block address signal BA0–BA7 into a latch (upon receipt of a predetermined address loading signal ALD) and then to the output as a second block address signal (where A0–A7≠$\overline{A0}$–$\overline{A7}$) upon receipt of the modify disable signal where BS0–BS7= 00000000. Alternatively, the block address register 140 generates a multi-block address erase signal (where A0–A7= $\overline{A0}$–$\overline{A7}$) upon detection of the decoded block size data signal (BS0–BS7≠00000000). For example, in the event the decoded block size data signal BS0–BS7=01, 03, 07, 0F, 1F, 3F, 7F, FF hex, the multi-block address erase signals will be A7–A0=01, 03, 07, 0F, 1F, 3F, 7F, FF hex, respectively, and $\overline{A7}$–$\overline{A0}$=01, 03, 07, 0F, 1F, 3F, 7F, FF hex, respectively.

Figure 6:
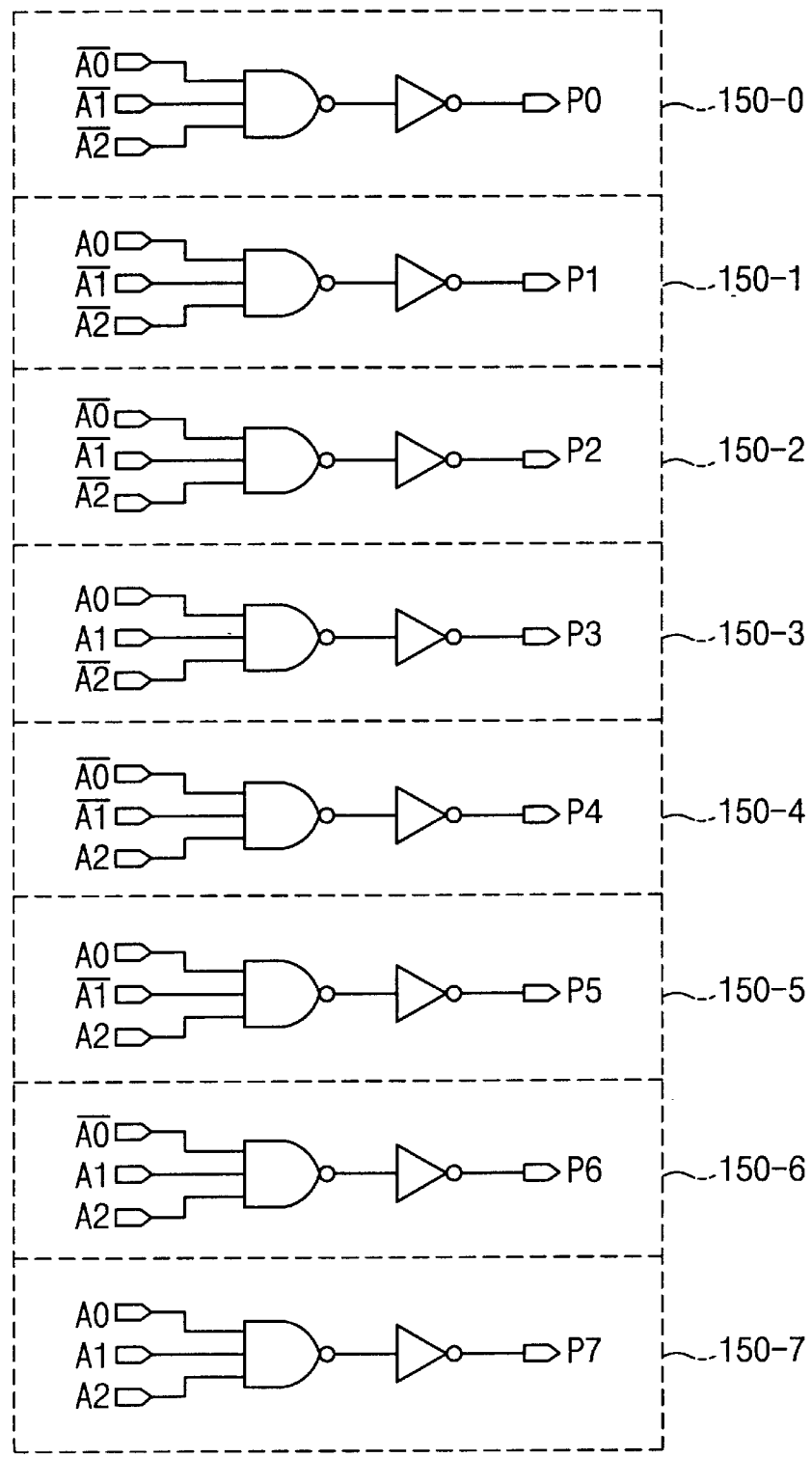
Figure 7:
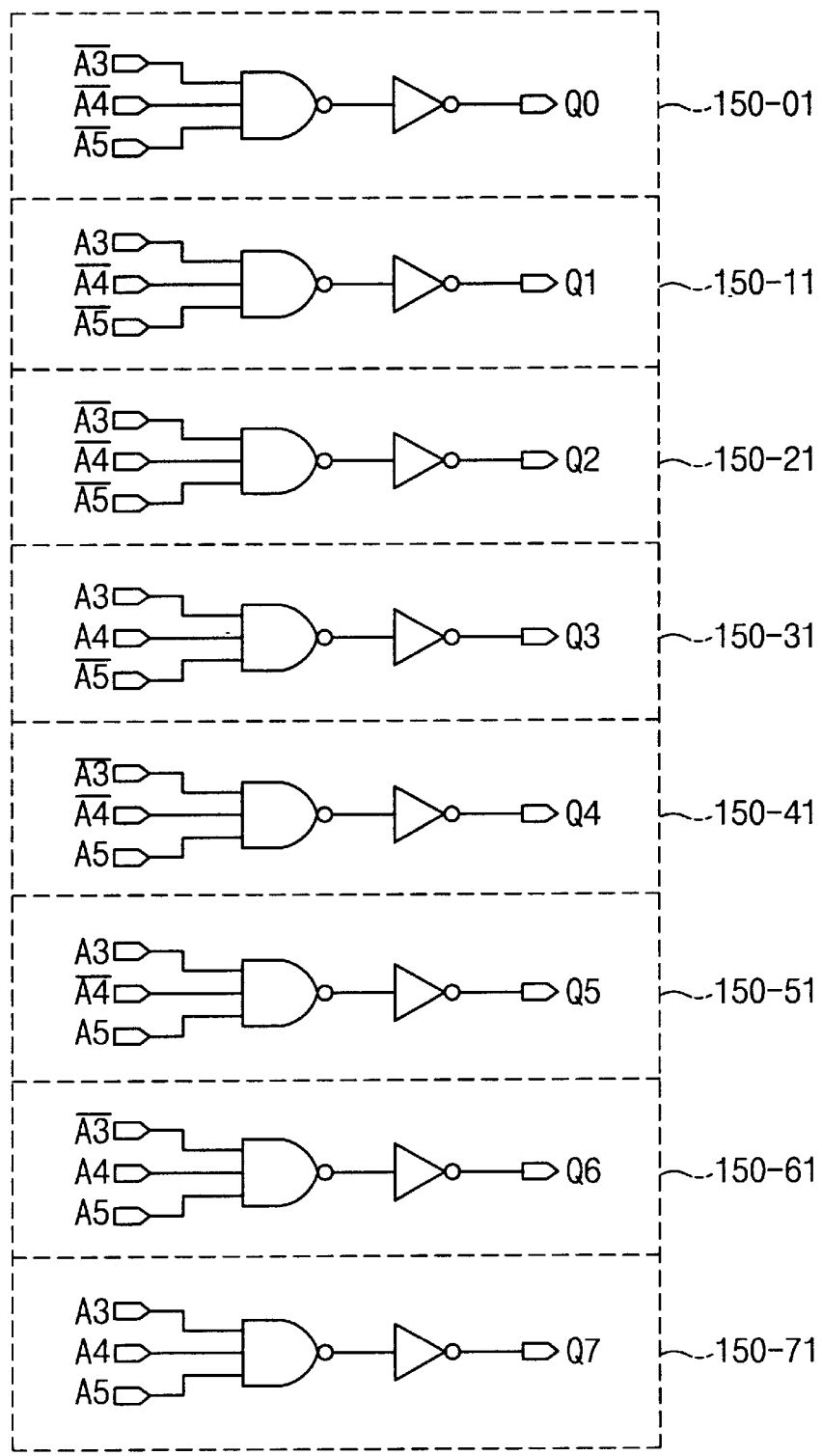

Referring now to FIGS. 6–8, a preferred block address predecoder 150 will be described. As illustrated, the block address predecoder 150 is coupled to an output of the block address register 140 and performs the functions of generating the predecoded block address signals $P_i$, $Q_i$ and $R_i$ which select a single one of the plurality of local decoders 200-i (e.g., where i=1–256) upon detection of the second block address signal (e.g., when A0–A7≠$\overline{A0}$–$\overline{A7}$) or select multiple ones of the plurality of local decoders upon detection of the multi-block address erase signal. Preferably, the number of local decoders selected upon the detection of the multi-block address erase signal is $2^n$ when the binary value of the block size data signal is $2^n$, where n is an integer. For example, in the event the memory device contains 256 blocks of memory cells, 2, 4, 8, 16, 32, 64, 128 may be erased simultaneously to thereby eliminate the need to perform repeated consecutive erase operations to erase large portions of the memory device. In addition, the detection of the second block address signal also enables the performance of a write (i.e., program), read and single block erase operation.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:

a memory cell array containing a plurality of blocks of memory cells therein;

a plurality of local decoders responsive to a predecoded block address signal, each of said local decoders electrically coupled a respective one of the plurality of blocks of memory cells; and block size modifying means, electrically coupled to said plurality of local decoders and responsive to a block size data signal and first block address signal, for enabling the simultaneous erasure of multiple ones of the plurality of blocks of memory cells during an erase time interval by generating the predecoded block address signal to select multiple ones of the plurality of local decoders.

2. The memory device of claim 1, wherein said block size modifying means comprises block size decoder means, responsive to the block size data signal and an erase flag signal, for decoding the block size data signal as a decoded block size data signal if the erase flag signal is in a first logic state and for generating a modify disable signal if the erase flag signal is in a second logic state, opposite the first logic state.

3. The memory device of claim 2, wherein said block size modifying means comprises block address register means coupled to an output of said block size decoder means and responsive to the first block address signal, for passing the first block address signal as a second block address signal upon detection of the modify disable signal and for generating a multi-block address erase signal upon detection of the decoded block size data signal.

4. The memory device of claim 3, wherein said block size modifying means comprises block address predecoder means, coupled to an output of said block address register means, for generating the predecoded block address signal to select a single one of the plurality of local decoders upon detection of the second block address signal or select multiple ones of the plurality of local decoders upon detection of the multi-block address erase signal.

5. The memory device of claim 4, wherein said block size decoder means comprises means for decoding the block size data signal as a decoded block size data signal having a lower byte portion of consecutive bits in the first logic state and an upper byte portion of consecutive bits in the second logic state.

6. The memory device of claim 4, wherein each of said local decoders comprises a charge pump.

7. The memory device of claim 4, where each block of memory cells comprises a plurality of NAND strings of EEPROM memory cells.

8. The memory device of claim 7, wherein said memory cell array comprises for each block of memory cells a string of pass transistors electrically coupled in series with a plurality of word lines.

9. The memory device of claim 8, wherein each of said strings of pass transistors is electrically coupled to an output of a respective local decoder.

10. The memory device of claim 4, wherein the number of local decoders selected upon the detection of the multi-block address erase signal is $2^n$ when the binary value of the block size data signal is $2^n$, where n is an integer.

\* \* \* \* \*